Sept. 2, 1952 G. BERGSON 2,609,459

HIGH INPUT IMPEDANCE TRANSISTOR AMPLIFIER

Filed Dec. 30, 1948

OUTPUT CURRENTS OMITTED

INPUT CURRENTS OMITTED

INVENTOR
GUSTAV BERGSON
BY H. O. Newton
ATTORNEY

Patented Sept. 2, 1952

2,609,459

UNITED STATES PATENT OFFICE 2,609,459

HIGH INPUT IMPEDANCE TRANSISTOR AMPLIFIER

Gustav Bergson, Germantown, Pa., assignor to Radio Corporation of America, a corporation of Delaware Application December 30, 1948, Serial No. 68,345

5 Claims. (Cl. 179—171)

This invention relates generally to amplifiers of the semi-conductor type, and particularly to novel circuits for operating such amplifiers having at least three electrodes which have been termed "transistors."

In the past, many attempts have been made to construct an amplifier which does not include a vacuum tube. One of the most recent amplifiers of this type utilizes a three-electrode semiconductor. This device, which has been termed the "transistor," has been disclosed in a series of three letters to the Physical Review by Bardeen and Brattain, Brattain and Bardeen, and Shockley and Pearson which appear on pages 230 to 233 of the July 15, 1948, issue. The new amplifier includes a block of semi-conducting material such as silicon or germanium which is provided with two closely adjacent point electrodes in contact with one surface region of the material and which are called "emitter" and "collector" electrodes, and a "base" electrode which provides a large-area low-resistance contact with another surface region of the semiconductor. The input circuit of the amplifier described in the publication referred to above is connected between the emitter and the base electrodes while the output circuit is connected between the collector and the base electrodes. The base electrode may be grounded.

The published circuit of the three-electrode semi-conductor amplifier has a number of disadvantages. For example, the power gain is comparatively low. Furthermore, the input impedance is of the order of 100 to 500 ohms, while the output impedance is of the order of 10,000 ohms or more. Thus, a step-down transformer is normally required between successive stages of a cascade amplifier utilizing transistors. Such a low input impedance is also undesirable since an amplifier should present a substantial minimum load on any signal source for reasons which are well known.

A bias source is connected between the emitter and base electrodes for biasing them in a relatively conducting polarity. This is the reason why the input impedance is low. On the other hand, the output impedance is high because the output signal is derived between the collector and base electrodes which are biased by another voltage source in a relatively non-conducting polarity. Still another disadvantage of the conventional three-electrode semi-conductor, when its use as an amplifier is desired, is its behavior as a negative resistance device under certain operating conditions. When high gain is sought, the amplifier then tends to become unstable.

It is, accordingly, the principal object of the present invention to provide a novel circuit for an amplifier of the three-electrode semi-conductor type which will result in a higher gain and a higher input impedance than that of the conventional circuit.

Another object of the invention is to provide a novel circuit arrangement for a three-electrode semi-conductor amplifier which will provide a higher input impedance than is provided in previously known circuits while preventing the occurrence of a negative input resistance under normal operating conditions.

A further object of the invention is to provide a new amplifying circuit for a transistor which will provide an input impedance and an output impedance of the same order of magnitude.

A conventional three-electrode semi-conductor amplifier is provided with an input circuit connected between the base electrode and the emitter electrode and an output circuit connected between the collector electrode and the base electrode. In accordance with the present invention the output circuit includes a first network connected between the collector electrode and the base electrode, and a second network, which may include a resistor, connected between the emitter and collector electrodes. The output signal is derived from the second network. The second network will cause a current to flow from the collector to the emitter electrode which current opposes the current of the input signal. Accordingly, the input impedance is raised and the gain is increased.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
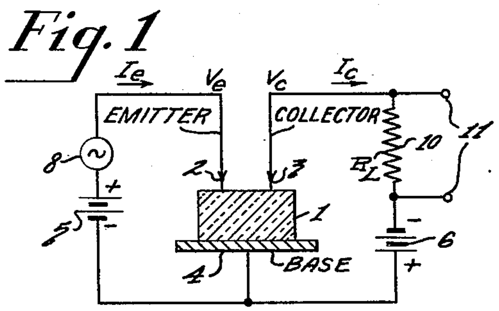
Fig. 1 is a circuit diagram of a known three-electrode semi-conductor amplifier.

Referring now to the drawing, in which like components have been designated by the same reference numerals, and particularly to Fig. 1 there is illustrated a previously known three-electrode semi-conductor device arranged as an amplifier. The amplifier comprises a block 1 of semi-conducting material which may consist, for example, of germanium or silicon containing a small but sufficient number of atomic impurity centers or lattice imperfections as are commonly employed for best results in crystal rectifiers. Germanium is the new preferred material for block 1 and, as will be further explained below, may be prepared so as to be an electronic N type semi-conductor. The surface of semi-conducting block 1 may be polished and etched in the manner explained in the paper by Bardeen and Brattain referred to. It is also feasible to utilize the germanium block from a commercial high-back-voltage germanium rectifier such as the 1N34 type for semi-conductor 1 and, in this case, further surface treatment may not be required.

Semi-conductor 1 is provided with three electrodes, viz. emitter electrode 2, collector electrode 3 and base electrode 4 as indicated in Fig. 1. Emitter electrode 2 and collector electrode 3 may be point contacts which may consist, for example, of tungsten or Phosphor bronze wires having a diameter of the order of 2 mils. The emitter and collector electrodes 2, 3 are ordinarily placed closely adjacent to each other and may be separated by a distance of from 2 to 10 mils. Base electrode 4 provides a large-area low-resistance contact with the bulk material of semi-conductor 1.

A suitable voltage source such as battery 5 is connected between emitter electrode 2 and base electrode 4 and is of such a polarity as to bias them in a relatively conducting direction. Accordingly, when the semi-conductor is of the N type, emitter electrode 2 should have a positive voltage with respect to base electrode 4 as illustrated. Another voltage source such as battery 6 is provided between collector electrode 3 and base electrode 4 and has such a polarity as to bias them in a relatively non-conducting direction. Consequently, since an N type semi-conductor is assumed for Fig. 1, collector electrode 3 should have a negative voltage with respect to base electrode 4. The source of the input signal indicated at 8 is connected in the emitter lead, that is, between emitter electrode 2 and base electrode 4. The output load $R_L$ indicated by resistor 10 is provided between collector electrode 3 and base electrode 4 and is in series with bias battery 6. The output signal may be derived across load resistor 10 from output terminals 11.

At the present time it is not possible to give a definite theory accounting for all details of the operation of the three-electrode semi-conductor amplifier. It is believed, however, that the following explanation will be helpful for a better understanding of the present invention. A semi-conductor is a material whose electrical conductivity lies intermediate between that of the best conductors and that of the best insulators. Although conduction in some materials may be ionic in nature, so that the actual motion of electrically charged atoms represents the flow of current, the present invention is of particular value in connection with those materials in which the atoms remain relatively fixed while conduction takes place by electrons. These latter materials are called electronic semi-conductors. It is appreciated that ionic conductors can also be of use in amplifier devices so that, although the discussion and explanation of operation is confined to electronic semi-conduction of the type found for example in silicon or germanium, the invention is not to be construed as so limited except as defined in the appended claims.

For some time it has been assumed that there are two types of such electronic semi-conductors, one called the N type (negative type) while the other is called the P type (positive type). The N type semi-conductor behaves as if there were present a limited number of free negative charges or electrons which canduct the current in a manner somewhat akin to that in which current conduction takes place in a metal. Such material, in a well-ordered crystal lattice, would not be expected to have many free electrons. It is therefore assumed that the free electrons which account for the conduction are donated by impurities or lattice imperfections which may be termed "donors." Thus, in an N type silicon crystal which is a semi-conductor, the donor may consist of small impurities of phosphorus. Since silicon has four valence electrons and phosphorus five, the excess valence electron of the occasional phosphorus atom is not required for the tetrahedral binding to adjacent silicon atoms in the crystal and hence is free to move. The current in an N type semi-conductor accordingly flows as if carried by negative charges (electrons).

In the P type of semi-conductor, current conduction appears to take place as if the carriers were positive charges. This is believed to be due to the presence of impurities which will accept an electron from an atom of the semi-conductor. Thus, a P type silicon crystal may contain a few boron atoms which act as acceptors. Since boron has only three valence electrons, it will accept an electron from a silicon atom to complete the atomic bond. There is, accordingly, a "hole" in the crystalline structure which might be considered a virtual positive charge. Under the influence of an external electrical field the hole or the holes will travel in the direction that a positive charge would travel.

If two contacts are made to an electronic semi-conductor of N or P type, and if these contacts are similar in nature and of equal area, an impressed voltage will lead to current flow of about the same magnitude with either polarity of voltage. However, it will ordinarily be found that there is a non-linear relation between current and voltage, as the latter is increased. This non-linear effect was first explained to be a result of the disturbance of the internal electronic energy levels of the crystal lattice due to the metal contact which was said to produce a so-called barrier layer, or energy hump. It could be shown that, with an N-type crystal, an increasing positive potential on the metal contact caused a change in the barrier-layer energy hump in such a direction as to allow electrons to flow relatively freely into the metal. A metal contact having a negative potential, however, would alter the field so as to repel the internal conduction electrons, and the only current flow would then be due to the escape of electrons from the metal over the energy hump of the barrier layer; this current flow would be quite small. The explanation was sufficient to explain crudely the observed phenomena as well as those with P-type material, in which the effects are similar with the opposite polarity of metal contact. Although, as indicated, there is a hypothetical rectification effect at the contact to either N or P type material, the two equal contacts will cancel out this effect and the current flow is independent of polarity and relatively small.

In the actual two-electrode rectifier (crystal diode), one contact is made to the bulk crystal and is of such large area that its resistance is extremely low for either direction of current flow. Thus, non-linear effects at this large-area contact are not of great significance compared with those at the second contact, which is of very small area (such as that of a wire having a sharp point). In this way, the hypothetical barrier layer at the crystal surface near the small-area contact can cause actual rectification. As already indicated, such an unequal contact area device made of an N-type semi-conductor will conduct readily when the small-area contact is positive in polarity and is relatively non-conducting when the small area contact is negative. For a two-electrode rectifier made of a P-type material the situation is reversed.

In the semi-conductor amplifier of three-electrodes, one large-area contact is used to the bulk crystal and two smaller-area contacts are used close to one another on a crystal surface. There are now two possible barrier layers but, even more important, it is believed that current may now flow from one small-area contact to the other one in a way requiring a much more correct explanation of the barrier-layer effect than the one involving only the presence of the metal contact. This will be discussed below in connection with N-type material but it is to be understood that analogous effects may occur with P-type material by appropriate reversal of potentials just as in the rectifier case.

The recently discovered amplifying properties of the three-electrode semi-conductor may be explained by extending the above theory as follows: Let it be assumed that germanium or silicon crystal used in the device is an N type semi-conductor throughout its bulk. However, it is now believed that a very thin surface layer of the crystal, closely related to the so-called barrier-layer effect mentioned above, may behave like a P type semi-conductor. This thin layer of P type, that is, "hole" conduction, may be caused by a chemical or physical difference in the behavior of the impurities on the surface of the crystal, or it may be caused by a change in the energy levels of the surface atoms due to the discontinuity of the crystal structure at the surface. In any case, an excess of holes is created in this surface layer of the semi-conductor. Even in the rectifier, the new hypothesis is of value since the original theory without the P layer failed to explain the lack of difference in rectification between high and low work function metal contacts and also led to predictions of a higher resistance in the conducting direction of rectifiers than was actually observed. The previous explanation of rectifiers has now been modified by assuming the presence of this surface P-layer on the crystal and it now seems probable that the rectifying barrier layer exists near the surface region at the P to N boundary. Thus, differences of the work functions of metallic points play a negligible role in the rectification, and the relatively larger barrier area now assumed accounts for the low resistance of the crystal in the conducting direction. Furthermore, it is now believed that conduction near the point contact is of the "hole" or virtual positive charge type, while inside the crystal it is of the electron, or negative charge type. For the three-electrode semi-conductor amplifier under discussion, this new theory is very important since the amplifier behavior is chiefly governed by the "hole" current on the surface of the crystal between the two point contacts.

Because the point contact 2 (of Fig. 1) known as the emitter electrode is biassed positive with respect to the crystal 1, conduction readily takes place through the barrier layer, with "holes" moving in the surface layer of the crystal while electrons carry the current in the interior of the crystal. However, since a nearby collector point contact or electrode 3 at a negative potential will cause an electric surface field and attract the positive "holes," the "holes" will not only flow into or through the crystal barrier layer but may also flow directly from emitter electrode 2 to collector electrode 3 along the surface of the crystal. The collector electrode barrier layer would normally prevent current flow unless the "holes" are provided by the emitter. Changing the voltage between emitter electrode 2 and the bulk crystal 1 will increase or decrease the emitter current available for flow in the P-type surface layer to the collector electrode 3.

Figure 2:
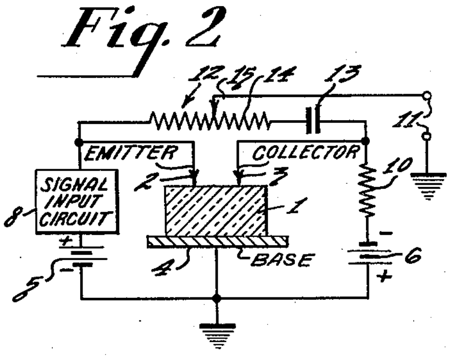
Fig. 2 is a circuit diagram of a three-electrode semi-conductor amplifier embodying the present invention.

The improved transistor circuit embodying the present invention is illustrated in Fig. 2. It differs essentially from the circuit of Fig. 1 by the provision of network 12 connected between collector electrode 3 and emitter electrode 2. Network 12 includes blocking capacitor 13 and resistor 14 arranged in series. Blocking capacitor 13 electrically insulates the bias batteries from each other. Resistor 14 is provided with variable tap 15, and the output signal may be obtained from output terminals 11 connected between tap 15 and ground as illustrated.

Figure 3:
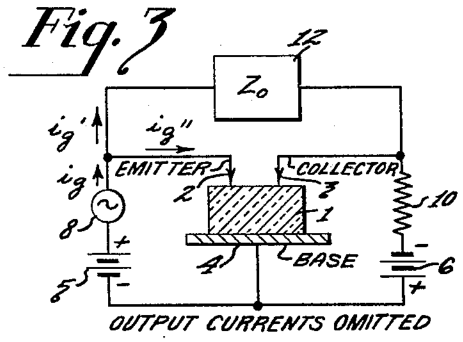
Figs. 3 and 4 are equivalent or schematic circuit diagrams of the amplifier circuit of Fig. 2 referred to in explaining the operation of the amplifier of the invention.
Figure 4:
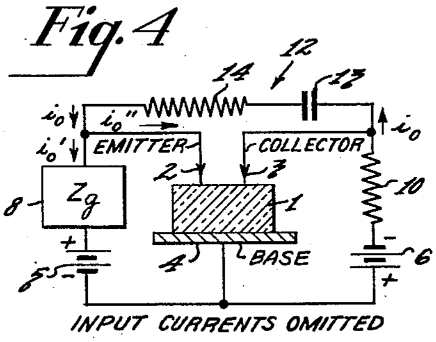

The operation of the circuit of Fig. 2 will be more readily understood by reference to Figs. 3 and 4. In Fig. 3, the input currents of the device have been illustrated and network 12 has been shown schematically by box 12 representing an impedance $Z_0$. The signal input circuit including generator 8 develops a current $i_g$ which divides into two currents $i_g'$ flowing into network 12 and $i_g''$ flowing into emitter electrode 2. Accordingly, by definition $i_g=i_g'+i_g''$.

The current $i_g''$ flowing into emitter electrode 2 will cause an amplified current to flow from collector electrode 3, a part of which flows through network 12. This portion of the output current has been indicated in Fig. 4 as $i_0$. Signal generator 8 has been indicated in Fig. 4 by a box indicating an impedance $Z_g$ and the currents caused by the signal source have been disregarded. The current $i_0$ flowing through network 12 will divide into two branches $i_0'$ flow into generator 8 and $i_0''$ flowing into emitter electrode 2. Again by definition $i_0=i_0'+i_0''$.

It will now be seen that the current $i_0$ opposes the current $i_g'$ flowing in network 12. If now $i_0$ is larger than $i_g'$, a net resulting current $i_0-i_g$ will flow into signal generator 8 and the effective net or resulting current from signal generator 8 is reduced. This, in turn, is equivalent to a higher input impedance of the amplifier. The input impedance of the circuit of Fig. 2 can accordingly be raised to such an extent that it approaches that of the output circuit. In other words, the input impedance and the output impedance may be made of the same order of magnitude. This will greatly facilitate the cascade arrangement of a plurality of three-electrode semi-conductor amplifiers. The gain of the circuit of Fig. 2 has been found to be approximately 12 decibels larger than that of the conventional circuit of Fig. 1.

Figure 5:
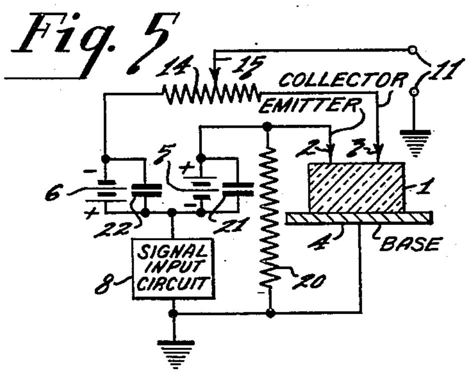
Figs. 5 and 6 are circuit diagrams of modifications of the amplifier circuit of the invention wherein the input circuit of the amplifier is stabilized to prevent the occurrence of oscillations.

The input resistance of a three-electrode semi-conductor amplifier as illustrated in Figs. 1 or 2 is negative under certain operating conditions. In other words, a decrease of the voltage applied between emitter electrode 2 and base electrode 4 will cause an increase of the total current flowing from base electrode 4. The base electrode 4, therefore, exhibits a negative resistance. It is, of course, not generally desirable that an amplifier have a negative input resistance because this may cause the amplifier to be unstable. The circuits of Figs. 5 and 6 will overcome this disadvantage of the conventional three-electrode semi-conductor amplifier. As illustrated in Fig. 5 resistor 20 is provided between emitter electrode 2 and base electrode 4 while load resistor 10 is omitted. Resistor 20 accordingly is arranged in parallel with signal input circuit 8 and bias battery 5 which may be shunted by capacitor 21 having a low impedance for signal-frequency currents. Bias battery 6 for collector electrode 3 may be provided between the high potential terminal of signal input circuit 8 and resistor 14. Bias battery 6 may also be bypassed by capacitor 22 having a low impedance for signal frequency currents. Resistor 14 is effectively connected between emitter electrode 2 and collector electrode 3. Blocking capacitor 13 is not required for the circuit of Fig. 5 and may be omitted. The resistance of resistor 20 should be of such a value as to provide a finite positive input impedance for the amplifier of Fig. 5 under normal operating conditions. From the characterstic curves of the amplifier the equivalent negative input resistance or conductance may be determined by well known methods. In the circuit of Fig. 5, the added resistance 20 should have a conductance which is greater than the negative input conductance of the amplifier. The amplifier is thus stabilized and resistor 20 will prevent the occurrence of a negative input impedance.

Figure 6:
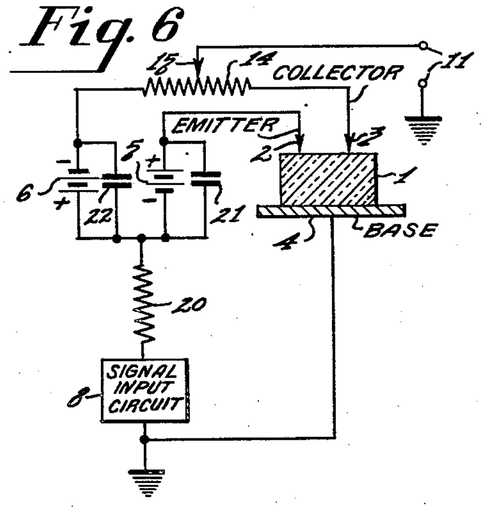

As illustrated in Fig. 6 resistor 20 may also be arranged in series with signal input circuit 8. The circuit of Fig. 6 otherwise operates in the same manner as does the amplifier of Fig. 5. In the circuit of Fig. 6 the added resistance of resistor 20 should have a resistance which is greater than the negative input resistance of the amplifier. For the circuits of Figs. 5 and 6, the amplified output signal may be derived from variable tap 15 on resistor 14 and may be obtained from output terminals 11 connected between ground and variable tap 15.

Resistor 20 is thus connected between the electrode having a large area, that is, base electrode 4, and one of the electrodes having a small area, that is, emitter electrode 2. In the circuit of Fig. 2 resistor 10 is also connected between the electrode of large area, that is, the base electrode 4 and one of the electrodes of small area, that is, collector electrode 3. Network 12 or resistor 14 is connected between the two electrodes of small area, that is, between collector electrode 3 and emitter electrode 2.

There has thus been disclosed a three-electrode semi-conductor amplifier having an input impedance of the order of magnitude of the output impedance. Furthermore, the gain of the amplifier is increased considerably. Finally, by providing resistive impedance in the input circuit the ampifier may be stabilized to prevent it from oscillating.

What is claimed is:

1. An amplifier circuit for a device consisting of a semi-conducting material, a base electrode, an emitter electrode and a collector electrode in contact with said material, said circuit comprising means including a source of potential for biasing said base and emitter electrodes in a relatively conducting polarity and for biasing said base and collector electrodes in a relatively non-conducting polarity, means maintaining said base electrode at a substantially fixed potential, a source of input signal connected between said base and emitter electrodes, a load impedance element connected directly between said base and collector electrodes, an output network including a resistor connected directly between said emitter and collector electrodes, and output terminals for connection to a load circuit connected directly between an intermediate point of said resistor and said base electrode, thereby to raise the effective input impedance of said device.

2. An amplifier circuit for a device consisting of a semi-conducting material, a base electrode, an emitter electrode and a collector electrode in contact with said material, said circuit comprising means including a source of potential for biasing said base and emitter electrodes in a relatively conducting polarity and for biasing said base and collector electrodes in a relatively non-conducting polarity, means maintaining said base electrode at a substantially fixed potential, a source of input signal, an impedance element connected in series with said signal source between said base and emitter electrodes and having an impedance greater than the negative input resistance of said amplifier circuit, thereby to stabilize said amplifier, an output network including a resistor connected directly between said emitter and collector electrodes, and output connections for connection to a load circuit directly coupled to an intermediate point of said resistor and to said base electrode, thereby to increase the effective input impedance of said device.

3. An amplifier circuit for a device consisting of a semi-conducting material, a base electrode, an emitter electrode and a collector electrode in contact with said material, said circuit comprising means including a source of potential for biasing said base and emitter electrodes in a relatively conducting polarity and for biasing said base and collector electrodes in a relatively non-conducting polarity, means maintaining said base electrode at a substantially fixed potential, a source of input signal connected between said base and emitter electrodes, an impedance element connected in shunt with said signal source directly between said base and emitter electrodes, thereby to stabilize said amplifier, a resistor connected directly between said emitter and collector electrodes, and output connections for connection to a load circuit directly coupled to an intermediate point of said resistor and to said base electrode, thereby to increase the effective input impedance of said device.

4. An amplifier circuit for a device consisting of a semi-conducting material, a base electrode, an emitter electrode and a collector electrode in contact with said material, said circuit comprising means including a source of potential for biasing said base and emitter electrodes in a relatively conducting polarity and for biasing said base and collector electrodes in a relatively non-conducting polarity, means maintaining said base electrode at a substantially fixed potential, a source of input signal connected between said base and emitter electrodes, a resistive impedance element connected directly between said base and emitter electrodes, said element having a resistance of such a magnitude as to present on combination with the input resistance of said device a positive input resistance for said input signal between said base and emitter electrodes, a resistor connected directly between said emitter and collector electrodes, and output connections for connection to a load circuit directly coupled to an intermediate point of said resistor and to said base electrode, thereby to increase the effective input impedance of said device.

5. An amplifier circuit for a device consisting of a semi-conducting material provided with a first base electrode of relatively large area and two further electrodes of relatively small area, said circuit comprising means including a source of power connected to said electrodes for supplying operating potentials to said device, means maintaining said first electrode at a substantially fixed potential, a source of input signal connected between said first electrode and one of said further electrodes, a first network including a first impedance element between said first electrode and one of said further electrodes, a second network including a resistor coupled directly between said further electrodes, and output connections for connection to a load circuit directly coupled to an intermediate point of said resistor and to said base electrode, thereby to increase the effective input impedance of said device.

GUSTAV BERGSON.

REFERENCES CITED

The following references are of record in the file of this patent:

UNITED STATES PATENTS

| Number | Name | Date |
|---|---|---|
| 2,476,323 | Rack | July 19, 1949 |
| 2,517,960 | Barney | Aug. 8, 1950 |
| 2,524,035 | Bardeen | Oct. 3, 1950 |